United States Patent
Hanano et al.

(10) Patent No.: US 10,946,494 B2
(45) Date of Patent: Mar. 16, 2021

(54) POLISHING AGENT, STOCK SOLUTION FOR POLISHING AGENT, AND POLISHING METHOD

(71) Applicant: Hitachi Chemical Company, Ltd., Tokyo (JP)

(72) Inventors: Masayuki Hanano, Tokyo (JP); Masaya Nishiyama, Tokyo (JP); Yutaka Goh, Tokyo (JP); Haruaki Sakurai, Tokyo (JP); Tomohiro Iwano, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 121 days.

(21) Appl. No.: 15/556,824

(22) PCT Filed: Mar. 8, 2016

(86) PCT No.: PCT/JP2016/057222
§ 371 (c)(1),
(2) Date: Sep. 8, 2017

(87) PCT Pub. No.: WO2016/143797
PCT Pub. Date: Sep. 15, 2016

(65) Prior Publication Data
US 2018/0043497 A1 Feb. 15, 2018

(30) Foreign Application Priority Data
Mar. 10, 2015 (JP) .............................. JP2015-046958

(51) Int. Cl.
*B24B 37/00* (2012.01)
*C09G 1/02* (2006.01)
(Continued)

(52) U.S. Cl.
CPC ............ *B24B 37/044* (2013.01); *B24B 37/00* (2013.01); *B24B 37/0056* (2013.01); *C09G 1/02* (2013.01);
(Continued)

(58) Field of Classification Search
CPC ... B24B 37/044; B24B 37/00; B24B 37/0056; C09G 1/02; C09G 3/1409; C09G 3/1436;
(Continued)

(56) References Cited

U.S. PATENT DOCUMENTS 6,984,588 B2 * 1/2006 Grover ..................... C09G 1/02
438/691
7,300,601 B2 * 11/2007 Liu .......................... C09G 1/02
252/79.1
(Continued)

FOREIGN PATENT DOCUMENTS

| CN | 101375376 A | 2/2009 |
| CN | 102585708 A | 7/2012 |

(Continued)

OTHER PUBLICATIONS

Machine Translation of JP2010056199A.*
(Continued)

*Primary Examiner* — Eileen P Morgan
(74) *Attorney, Agent, or Firm* — Morgan, Lewis & Bockius LLP

(57) ABSTRACT

A polishing agent for polishing a resin comprises abrasive grains, a water-soluble polymer having an ether bond, an organic solvent and water, wherein the abrasive grains have a positive charge in the polishing agent and an average particle diameter of the abrasive grains is larger than 20 nm.

19 Claims, 2 Drawing Sheets

(51) Int. Cl.
*B24B 37/04* (2012.01)
*C09K 3/14* (2006.01)
*H01L 21/311* (2006.01)
*H01L 21/3105* (2006.01)
*B24B 37/005* (2012.01)

(52) U.S. Cl.
CPC .......... *C09K 3/1409* (2013.01); *C09K 3/1436* (2013.01); *H01L 21/31058* (2013.01); *H01L 21/31144* (2013.01)

(58) Field of Classification Search
CPC ................ C09K 3/1409; C09K 3/1436; H01L 21/31058; H01L 21/31144
USPC ...................................... 451/36, 56, 28, 287
See application file for complete search history.

(56) References Cited

U.S. PATENT DOCUMENTS

| | | | | |
|---|---|---|---|---|
| 7,361,603 B2* | 4/2008 | Liu | ............................ | C09G 1/02 257/E21.304 |
| 2008/0254628 A1* | 10/2008 | Boggs | .................. | H01L 21/3212 438/693 |
| 2011/0039475 A1* | 2/2011 | Hoshi | ................ | H01L 21/31053 451/28 |
| 2013/0171824 A1* | 7/2013 | Li | .......................... | C09K 3/1463 438/693 |
| 2013/0260558 A1* | 10/2013 | Oota | .................. | H01L 21/30625 438/693 |

FOREIGN PATENT DOCUMENTS

| | | | |
|---|---|---|---|
| CN | 102597142 A | | 7/2012 |
| JP | 2008-541158 A | | 11/2008 |
| JP | 2009-016788 A | | 1/2009 |
| JP | 2009-224695 A | | 10/2009 |
| JP | 2010-056199 A | | 3/2010 |
| JP | 2010056199 A | * | 3/2010 |
| JP | 2010-080842 A | | 4/2010 |
| JP | 2011-060888 A | | 3/2011 |
| JP | 2012-073606 A | | 4/2012 |
| TW | 201229163 A1 | | 7/2012 |
| WO | 2006/119709 A1 | | 11/2006 |

OTHER PUBLICATIONS

International Search Report issued in corresponding International Patent Application No. PCT/JP2016/057222 dated Jun. 14, 2016.
International Preliminary Report on Patentability issued in corresponding International Patent Application No. PCT/JP2016/057222 dated Sep. 12, 2017.

* cited by examiner (a)

(b)

(c)

(d)

(e)

(f)

(a)

(b)

(c)

(d)

(e)

(f)

(g)

(h)

POLISHING AGENT, STOCK SOLUTION FOR POLISHING AGENT, AND POLISHING METHOD

TECHNICAL FIELD

The present invention relates to a polishing agent, a stock solution for the polishing agent, and a polishing method for removing at least a part of a resin by chemically-mechanically polishing (hereinafter referred to as "CMP" in some cases) a base material having a resin.

BACKGROUND ART

In recent years, new microfabrication technologies have been developed along with the tendencies of higher integration and higher performance of semiconductor integrated circuits (hereinafter referred to as "LSI"). The CMP is one of such technologies, and is a technique that is frequently used in the LSI manufacturing process (in particular, flattening of interlayer insulating material, formation of metal plug, formation of buried wiring and the like in multilayer interconnection forming process).

In addition, along with the tendencies of the higher integration and higher performance of LSI, refinement of the pattern rule is required. Examples of processes that have recently received attention include a double patterning process (for instance, refer to following Patent Literature 1). In the double patterning process, the first pattern is formed by the first exposure and development, and then the second pattern is formed on the space portion and the like of the first pattern, by the second exposure and development.

Several processes are proposed as a method of the double patterning (for instance, refer to following Patent Literature 2). An example of the double patterning will be described with reference to FIG. 1. Firstly, a base material is prepared wherein the base material has a substrate 1 and silicon oxide 2 which has a predetermined pattern and is formed on the substrate 1 (FIG. 1(a)). Next, a photoresist 3 is formed on the substrate 1 and the silicon oxide 2 (FIG. 1(b)). The entire surface layer portion of the photoresist 3 is removed by dry etching so that the photoresist 3 having a predetermined thickness remains on the silicon oxide 2 (FIG. 1(c)). A predetermined portion of the photoresist 3 on the silicon oxide 2 is removed by exposure and development processes to form a groove portion 4 in the photoresist 3 (FIG. 1(d)). A portion of the silicon oxide 2, which has been exposed to the groove portion 4, is removed by dry etching (FIG. 1(e)). The photoresist 3 is stripped off to obtain the silicon oxide 2 having a predetermined pattern (FIG. 1(f)).

In the above double patterning process, a technique of using a resin film such as a spin-on-carbon film (SOC: Spin-on-carbon; a carbon-containing film) as the photoresist and using CMP other than dry etching is proposed. By using CMP, it is possible to reduce the variation in the thicknesses of the surface layer portions of the SOC film, as compared with dry etching.

CITATION LIST

Patent Literature

Patent Literature 1: Japanese Unexamined Patent Publication No. 2009-16788
Patent Literature 2: Japanese Unexamined Patent Publication No. 2012-73606
Patent Literature 3: Japanese Unexamined Patent Publication No. 2011-60888

SUMMARY OF INVENTION

Technical Problem

In recent years, with respect to the CMP for such a resin, it is required to polish the resin at a favorable polishing rate. A composition of the polishing agent for the CMP generally differs depending on an object to be polished (substance to be removed and substance which remains without being removed). The polishing agent for the CMP of a resin is only slightly known (for instance, refer to Patent Literature 3 above). It is difficult for polishing agents for other uses (for instance, for polishing glass, for forming STI and for polishing metallic materials) to remove the resin by polishing.

Many conventional polishing agents for CMP are polishing agents for polishing relatively hard materials such as insulating materials (excluding resins) and metallic materials, and make polishing progress by a mechanical action of abrasive grains that are comprised in the polishing agent for CMP. However, the resin contains an organic compound as a main component, and is a material that is soft as compared with an insulating material (excluding a resin) and a metallic material. Therefore, when the resin is polished with the use of the conventional polishing agent for CMP, the mechanical action of the abrasive grains is dispersed. Because of this, polishing does not almost progress, or the polishing progresses while giving damages to the resin.

The present invention has been designed to solve the above-described problems, and an object is to provide a polishing agent, a stock solution for the polishing agent, and a polishing method that can remove a resin at a favorable polishing rate.

Solution to Problem

As a result of having made an extensive investigation, the present inventors have found out that it is possible to remove a resin at a favorable polishing rate by using: abrasive grains which have a positive charge in a polishing agent and have the average particle diameter of larger than 20 nm; a water-soluble polymer having an ether bond; and an organic solvent.

Specifically, the polishing agent for polishing a resin of the present invention comprises abrasive grains, a water-soluble polymer having an ether bond, an organic solvent and water, wherein the abrasive grains have a positive charge in the polishing agent, and an average particle diameter of the abrasive grains is larger than 20 nm.

According to the polishing agent of the present invention, it is possible to remove a resin at a favorable polishing rate.

The above-described water-soluble polymer preferably contains a polyether, and more preferably contains a polysaccharide. In this case, a resin can be removed at a further favorable polishing rate.

The above-described abrasive grains preferably contain colloidal silica. In this case, the polishing scratches (which mean scratches that appear on polished surface after polishing, hereinafter the same) can be reduced while keeping a high polishing rate with respect to a resin.

The pH of the polishing agent of the present invention is preferably 1.0 to 8.0. In this case, the polishing rate for a resin can be further enhanced, and the dissolution of the abrasive grains can be suppressed.

The polishing agent of the present invention may further comprise an acid component. In this case, the liquid state stability of the polishing agent can be enhanced, and a polished surface can be flattened successfully. In addition, in the case of simultaneously polishing a wiring metal or a barrier metal in addition to the resin, the acid component promotes the dissolution of the wiring metal or the barrier metal and can enhance the polishing rate for a wiring metal or a barrier metal. It is also possible to adjust the pH by using the acid component.

The polishing agent of the present invention may further comprise a polishing inhibitor for insulating material. In this case, it is possible to selectively remove a resin with respect to an insulating material (excluding resin).

The polishing agent of the present invention may further comprise a corrosion preventive agent. In this case, the corrosion preventive agent forms a protective film on the wiring metal such as a copper-based metal and a cobalt-based metal, and thereby suppresses etching for the wiring metal, which tends to easily decrease roughening of the polished surface.

The polishing agent of the present invention may further comprise an oxidizing agent. In this case, it is possible to enhance the polishing rate for a metallic material.

The polishing agent of the present invention may further comprise a pH adjusting agent.

The polishing agent of the present invention may further comprise a surfactant. In this case, it is possible to easily adjust the polishing rate for a material to be polished. In addition, it is possible to reduce polishing scratches and can suppress the corrosion of the wiring metal and the barrier metal.

The polishing agent of the present invention may be stored as a multi-pack polishing agent that has a first liquid which comprises abrasive grains and water and a second liquid which comprises the above-described water-soluble polymer, the organic solvent and water. In this case, it is possible to enhance the liquid state stability.

A stock solution for a polishing agent of the present invention is a stock solution for a polishing agent for obtaining the above-described polishing agent, wherein the stock solution is diluted with water to obtain the above-described polishing agent. In this case, it is possible to reduce the cost, the space and the like which are necessary for transportation, storage and the like of the polishing agent.

A first embodiment of the polishing method of the present invention comprises: a step of preparing a base material having a resin; and a step of chemically-mechanically polishing the base material by using the polishing agent to remove at least a part of the resin. A second embodiment of the polishing method of the present invention comprises: a step of preparing a base material having a resin; a step of obtaining the polishing agent by diluting the stock solution for a polishing agent with water; and a step of chemically-mechanically polishing the base material by using the polishing agent to remove at least a part of the resin. These polishing methods can remove the resin at a favorable polishing rate.

Advantageous Effects of Invention

According to the present invention, a resin can be removed at a favorable polishing rate.

In addition, according to the present invention, it is possible to provide a use of a polishing agent or a stock solution for the polishing agent, for the polishing of chemically-mechanically polishing the base material having a resin and removing at least a part of the resin. The polishing agent and the stock solution for the polishing agent of the present invention can be used also for polishing a resin of a wiring board.

DESCRIPTION OF EMBODIMENTS

<Definition>

Figure 1:
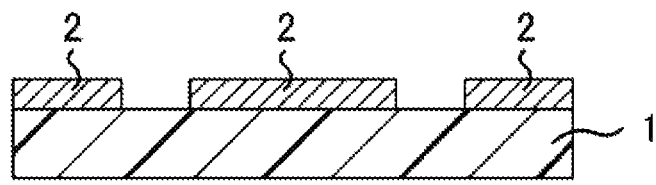
FIG. 1 is a schematic cross-sectional view of a conventional double patterning process.
Figure 1:
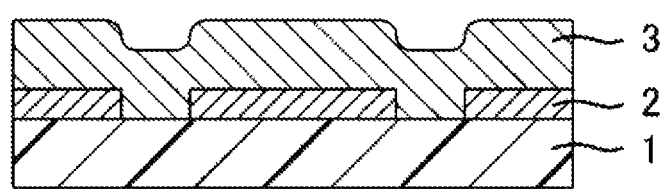
Figure 1:
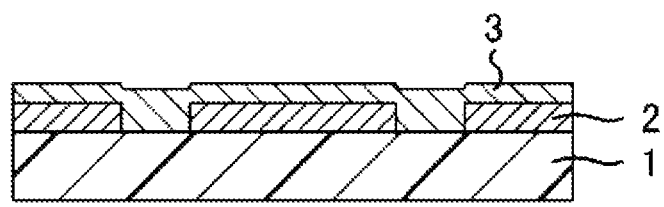
Figure 1:
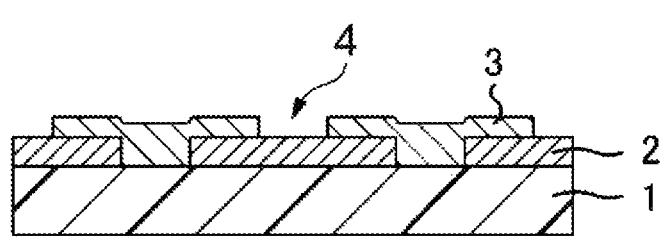
Figure 1:
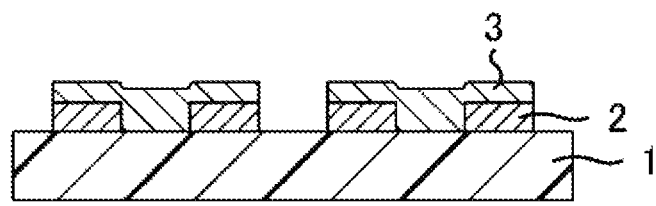
Figure 1:
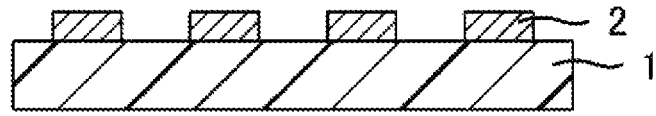

In the present specification, a term "step" includes not only an independent step but also a step by which an intended action of the step is achieved, though the step cannot be clearly distinguished from other steps.

In the present specification, a numerical range that has been indicated with the use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples.

In the present specification, when a plurality of substances corresponding to each component exist in the composition, the content of each component in the composition means the total amount of the plurality of substances that exist in the composition, unless otherwise specified.

In the present specification, "polishing rate (Removal Rate)" means a rate at which the material to be polished is removed per unit time.

In the present specification, when the polishing agent is obtained by adding water or the like to the stock solution for the polishing agent, "to dilute stock solution for polishing agent to X times" means such dilution that the mass of the polishing agent is X times the mass of the stock solution for the polishing agent. For instance, obtaining the polishing agent by adding water of the same mass as the mass of the stock solution for the polishing agent to the stock solution is defined as an operation of diluting the stock solution for the polishing agent to twice.

An embodiment of the present invention will be described below.

<Polishing Agent>

A polishing agent for polishing a resin of the present embodiment (hereinafter simply referred to as "polishing agent" in some cases) is a composition which comes in contact with a surface to be polished at the time of polishing, and is a polishing agent for CMP, for instance.

The polishing agent of the present embodiment is a polishing agent for subjecting a base material having a resin to CMP, to remove at least a part of the resin. The polishing agent of the present embodiment comprises abrasive grains, a water-soluble polymer having an ether bond, an organic solvent and water. The polishing agent of the present embodiment may be used for polishing a metallic material (for instance, wiring metal such as copper-based metal and cobalt-based metal; and barrier metal), together with the resin. In addition, the polishing agent of the present embodiment may be used for selectively polishing the resin with respect to an insulating material (excluding resin, hereinafter the same) (for instance, insulating material such as silicon oxide).

(Resin)

Examples of the resin, which is the objects to be polished, include resin materials such as a phenol resin, an epoxy resin, an acrylic resin, a methacrylic resin, a novolak resin, a polyester resin (unsaturated polyester resin and the like), a polyimide resin, a polyamide imide resin, polybenzoxazole (PBO), a polyallyl ether resin, and a heterocycle-containing resin (excluding resins exemplified in the above description). Examples of the "heterocycle-containing resin" include a pyrrole-ring-containing resin, a pyridine-ring-containing resin, and an imidazole-ring-containing resin. A method for forming the resin is not limited in particular, but examples include a vapor-deposition method and a spin coating method. The shape of the resin is not limited in particular, but is a film shape (resin film), for instance. The polishing agent of the present embodiment can also be used for polishing a resin substrate.

Components and the like that are comprised in the polishing agent of the present embodiment will be described in detail below.

(Abrasive Grain)

The polishing agent of the present embodiment comprises abrasive grains. The abrasive grains have a positive charge in the polishing agent. In addition, the average particle diameter of the abrasive grains is larger than 20 nm. The polishing agent comprises such abrasive grains, and thereby it is possible to obtain a favorable polishing rate for a resin.

It is considered that, in the case where the resin is removed by CMP, it becomes easy for the polishing rate for a resin to become high, by using abrasive grains having a positive charge in the polishing agent. However, with only the abrasive grains having the positive charge, the resin cannot be removed at the favorable polishing rate. In contrast to this, in the present embodiment, the average particle diameter of the abrasive grains is adjusted, and the water-soluble polymer having the ether bond and the organic solvent are used; and thereby a favorable polishing rate for a resin can be obtained.

It can be determined whether or not the abrasive grains have the positive charge in the polishing agent by measuring a zeta potential of the abrasive grains in the polishing agent. In the case where the zeta potential of the abrasive grains in the polishing agent is measured and the numerical value exceeds 0 mV, it can be determined that the abrasive grains have the positive charge.

The zeta potential can be measured with, for instance, trade name: DELSA NANO C made by Beckman Coulter, Inc. The zeta potential ($\zeta$ [mV]) can be measured according to the following procedure. First, a sample is obtained by diluting the polishing agent with pure water in the zeta potential measuring apparatus so that the scattering intensity of a measurement sample becomes $1.0 \times 10^4$ to $5.0 \times 10^4$ cps (here, "cps" means counts per second, in other words, counts per second, and is a counting unit for particles). Then, the sample is placed in a cell for measuring the zeta potential, and the zeta potential is measured. For instance, in order to adjust the scattering intensity to the above-described range, the polishing agent can be diluted so that the abrasive grains become 1.7 to 1.8 mass %.

Examples of a method for adjusting the abrasive grains so as to have the positive charge in the polishing agent include a method of controlling a method for producing abrasive grains, a method of adjusting a pH of the polishing agent, and a method of subjecting the abrasive grains to surface treatment. The case where silica is used as the abrasive grains will be taken as an example and be described. General silica has a negative charge in a liquid, but tends to have a positive charge by lowering a pH of the polishing agent. In addition, it is also possible to obtain silica having a positive charge, by surface-treating the silica with the use of a coupling agent having a cationic group.

The zeta potential is preferably 5 mV or higher, more preferably 10 mV or higher and further preferably 14 mV or higher, from the viewpoint that a further favorable polishing rate for a resin and favorable storage stability are obtained. The upper limit of the zeta potential is not limited in particular, but may be, for instance, 100 mV or less, 50 mV or less, or 20 mV or less.

The average particle diameter of the abrasive grains is larger than 20 nm, from the viewpoint that a sufficient mechanical polishing force is obtained and the polishing rate for a resin becomes high. The average particle diameter of the abrasive grains is preferably 25 nm or larger, more preferably 30 nm or larger, further preferably 50 nm or larger, and particularly preferably 70 nm or larger, from the viewpoint that a sufficient mechanical polishing force is easily obtained and the polishing rate for a resin becomes higher. In addition, the average particle diameter of the abrasive grains is preferably 200 nm or smaller, more preferably 120 nm or smaller, further preferably 100 nm or smaller, and particularly preferably 80 nm or smaller, from the viewpoint that favorable dispersion stability in the polishing agent is obtained and the number of occurrence of polishing scratches becomes less which occur due to the CMP.

The "average particle diameter" of the abrasive grains means an average secondary particle diameter of the abrasive grains. The above-described average particle diameter means a value of D50 (median diameter of volume distribution; cumulative median value) which is obtained when the polishing agent has been measured with a dynamic light scattering type particle size distribution meter (for instance, trade name: COULTER N4 SD made by COULTER Electronics Inc.).

Specifically, the average particle diameter can be measured by the following procedure. First, approximately 100 μL (L represents liter, hereinafter the same) of the polishing agent is measured out, and the polishing agent is diluted with ion-exchanged water so that the content of the abrasive grain becomes approximately 0.05% by mass (content in which transmissivity (H) at the time of measurement is 60 to 70%) to obtain the diluted solution. Then, the diluted solution is charged into a sample tank of the dynamic light scattering type particle size distribution meter, and the average particle diameter can be measured through a read-out value which is displayed as D50.

In addition, the above-described abrasive grains are preferably particles in which only less than two particles of primary particles by an average are agglomerated, and more preferably particles in which only less than 1.2 particles of primary particles by an average are agglomerated, from the viewpoint that a further favorable polishing rate for a resin is obtained. The upper limit of the degree of association of the abrasive grains differs depending on the primary particle diameter of the abrasive grains to be used, and is considered to be acceptable if the secondary particle diameter is within the range described above. Incidentally, the above-described degree of association can be obtained as a ratio (secondary particle diameter/primary particle diameter) between the secondary particle diameter and the primary particle diameter which have been determined.

As for a method of measuring the above-described primary particle diameter, the primary particle diameter can be measured with a known transmission electron microscope (for instance, H-7100FA made by Hitachi, Ltd.). For instance, an image of the particles is photographed with the use of the above-described electron microscope, a biaxial average primary particle diameter of a predetermined number of arbitrary particles is calculated, and an average value of these particle diameters is determined. In the case where the particle size distribution is wide, the above-described predetermined number should be a numerical quantity in which the average value becomes stable. In the case where colloidal silica or colloidal alumina is used as the abrasive grains, the particle diameters are generally uniform, and accordingly the number of particles to be measured may be approximately 20 particles, for instance.

Specifically, a rectangle (circumscribed rectangle) is drawn which circumscribes a selected particle, and is arranged so that the major axis thereof becomes longest. Then, on the basis of the major axis L and the minor axis B of the circumscribed rectangle, the biaxial average primary particle diameter of one particle is calculated as (L+B)/2. This operation is performed on arbitrary 20 particles, and the average value of the obtained values is referred to as the biaxial average primary particle diameter in the present embodiment. This operation can be automated through a computer program.

The standard deviation of the average particle size distribution in the abrasive grains is preferably 10 nm or smaller, and more preferably 5 nm or smaller. As for a method of measuring the standard deviation of the average particle size distribution, the abrasive grains in the polishing agent are charged into COULTER N4SD made by COULTER Electronics Inc., and the value of the standard deviation can be obtained from the chart of the particle diameter distribution.

Examples of the abrasive grains include at least one selected from the group consisting of silica, alumina, zirconia, ceria, titania, germania, a hydroxide of cerium, a resin, diamond, silicon carbide, cubic boron nitride and modified substances thereof. Examples of the silica include colloidal silica and fumed silica, and among them, the colloidal silica is preferable from the viewpoint of being capable of reducing polishing scratches while keeping a high polishing rate for a resin. As the alumina, colloidal alumina can also be used. Examples of the above-described modified substances include: an abrasive grains of silica, alumina, zirconia, ceria, titania, germania, a hydroxide of cerium or the like, in which the surfaces thereof have been modified with an alkyl group; and a composite abrasive grain in which the surface of the abrasive grain has another abrasive grain attached thereon.

A method of modifying the surface of the abrasive grain with the alkyl group is not limited in particular, but examples include a method of making a hydroxyl group (hydroxyl group) which exists on the surface of the abrasive grain react with an alkoxysilane having an alkyl group. The alkoxysilane having the alkyl group is not limited in particular, but examples include monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane and trimethylmonoethoxysilane. The reaction method is not limited in particular, but examples include a method of placing a polishing agent that comprises abrasive grains and alkoxysilane at a room temperature to cause a reaction, and a method of conducting a heating so as to accelerate the reaction. The modified substance in which the surface of the abrasive grain is modified with the alkyl group shows good compatibility with the resin, and easily enhances the polishing rate for a resin.

The content of the abrasive grain is preferably 0.01 mass % or more, more preferably 0.1 mass % or more, further preferably 0.5 mass % or more, particularly preferably 1.0 mass % or more, extremely preferably 2.0 mass % or more, and very preferably 3.0 mass % or more on the basis of the total mass of the polishing agent from the viewpoint that a sufficient mechanical polishing force is easily obtained and a polishing rate for a resin becomes higher. The content of the abrasive grain is preferably 20 mass % or less, more preferably 15 mass % or less, further preferably 10 mass % or less, and particularly preferably 5.0 mass % or less on the basis of the total mass of the polishing agent from the viewpoint that it is easy to avoid an increase in viscosity of the polishing agent, the viewpoint that it is easy to avoid the agglomeration of the abrasive grains, the viewpoint that it is easy for polishing scratches to be reduced, and the viewpoint that it is easy to handle the polishing agent.

(Water-Soluble Polymer having Ether Bond)

The polishing agent of the present embodiment comprises a water-soluble polymer having an ether bond. Because the polishing agent comprises the water-soluble polymer having the ether bond, a favorable polishing rate with respect to a resin can be obtained.

The reason why such an effect can be obtained is not clear, but the present inventors assume in the following way. Specifically, the water-soluble polymer having the ether bond deprives the abrasive grain of the hydration water, thereby the hydrophilicity of the abrasive grain decreases, and the affinity between the hydrophobic resin and the abrasive grain increases. As a result, it is considered that the polishing rate for a resin by the abrasive grains enhances.

The water-soluble polymer having the ether bond is not limited in particular as long as it is a polymer which has the ether bond and is soluble or miscible in water, and examples include polyether and monoether compounds. The water-soluble polymer having the ether bond is preferably polyether, from the viewpoint that the polishing rate for a resin easily enhances.

Examples of the above-described polyether include polysaccharides, polyalkylene glycols, polyglycerin, polyoxypropylene polyglyceryl ether, polyoxyethylene polyglyceryl ether, glycerol fatty acid esters, diglycerol fatty acid esters, aromatic glycol ethers, aliphatic glycol ethers, ester-based glycol ethers, propylene oxide adducts, gallic acid glycosides, glycosides of phenols, glycosides of polyphenols, ester compounds of sugar, polyoxyethylene glyceryl isostearate, polyoxyethylene glyceryl triisostearate, 1,4-di(2-hydroxyethoxy)benzene, 2,2-bis(4-polyoxyethylene-oxyphenyl)propane, 2,2-bis(4-polyoxypropyleneoxyphenyl)propane, ethylene glycol monophenyl ether, diethylene glycol monophenyl ether, polyoxyalkylene monophenyl ethers, propylene glycol monophenyl ether, polyoxypropylene monomethyl phenyl ether, polyethylene glycol monomethyl ether, pentaerythritol polyoxyethylene ether, ethylene glycol monoallyl ether, polyoxyethylene monoallyl ether, dimethylol heptane EO adducts, diglycerol fatty acid esters, and alkyl glucosides.

The water-soluble polymer having the ether bond is preferably the polysaccharides, and more preferably α-glucose polymers, from the viewpoint of suppressing the aggregation of the abrasive grains (colloidal silica and the like) in the polishing agent. In the present specification, the "polysaccharides" are defined as substances which have been polymerized with a degree of polymerization of 2 or more by a glycosidic bond, unless otherwise specified.

Examples of the polysaccharides include sucrose, lactulose, lactose, trehalose, maltose, cellobiose, kojibiose, nigerose, isomaltose, isotrehalose, neotrehalose, sophorose, laminaribiose, gentiobiose, turanose, maltulose, palatinose, gentiobiulose, mannobiose, melibiose, melibulose, neolactose, galactosucrose, scillabiose, rutinose, rutinulose, vicianose, xylobiose, primeverose, trehalosamine, maltitol, cellobionic acid, lactosamine, lactose diamine, lactobionic acid, lactitol, hyalobiuronic acid, sucralose, nigerotriose, maltotriose, melezitose, maltotriulose, raffinose, kestose, nystose, nigerotetraose, stachyose, amylose, dextran, dextrin, maltodextrin, cluster dextrin, cycloawaodorin, laminaran, callose, PGA, pectin, glucomannan, gellan gum, curdlan, psyllium, locust bean gum, pullulan, alginic acid, tamarind, carrageenan, CMC, xanthan gum, arabic gum, guar gum, pectin, soybean polysaccharides, fructan, glycogen, α-cyclodextrin, β-cyclodextrin, γ-cyclodextrin, isomaltooligosaccharide, galactooligosaccharide, xylooligosaccharide, soybean oligosaccharide, nigerooligosaccharide, fruit-oligosaccharide and fructooligosaccharide.

Examples of the α-glucose polymers include amylose, dextran, dextrin, maltodextrin, cluster dextrin, α-cyclodextrin, β-cyclodextrin, γ-cyclodextrin, maltose, isomaltose, maltotriose and stachyose.

Examples of the above-described dextrin include: dextrin having an aldehyde group at the end of a decomposed substance, which is obtained by the decomposition of starch (hereinafter referred to as "general dextrin" so as to be distinguished from other dextrins); indigestible dextrin collected by purifying a substance, that is a part of starch, which has not been easily decomposed in a process of decomposition of starch; and reduction type dextrin obtained by reducing the above-described aldehyde terminal with hydrogenation to convert the aldehyde terminal to a hydroxyl group. Any one of these compounds can be used as the dextrin.

Examples of the α-glucose polymers include: "NSD" series made by San-ei Suchrochemical Co., Ltd.; "SUNMALT-S" and "Sundec" series made by Sanwa Starch Co., Ltd.; "H-PDX", "Max 1000", "TK-16", "Fibersol 2" and "Fibersol 2H" made by Matsutani Chemical Industry Co., Ltd.; and "Cluster Dextrin" made by NIHON SHOKUHIN KAKO CO., LTD.

The α-glucose polymer preferably contain at least one selected from the group consisting of a structural unit represented by the following formula (I-A) and a structural unit represented by the following formula (I-B), and is more preferably at least one selected from the group consisting of the dextrin and the maltose, from the viewpoint of polishing the resin at a further favorable polishing rate. In the case where the α-glucose polymer includes both of the structural unit represented by the formula (I-A) and the structural unit represented by the formula (I-B), the arrangement is not limited, and may be regular or random. The α-glucose polymer is preferably at least one selected from the group consisting of dextrin and maltose, from the viewpoint of being excellent in versatility.

[Chemical Formula 1]

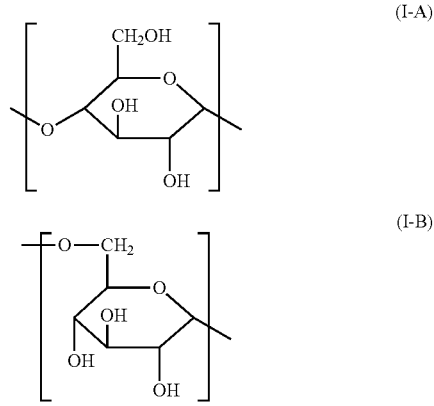

The α-glucose polymer may have at least one of structural units represented by the following formulae (II-A) to (II-F).

[Chemical Formula 2]

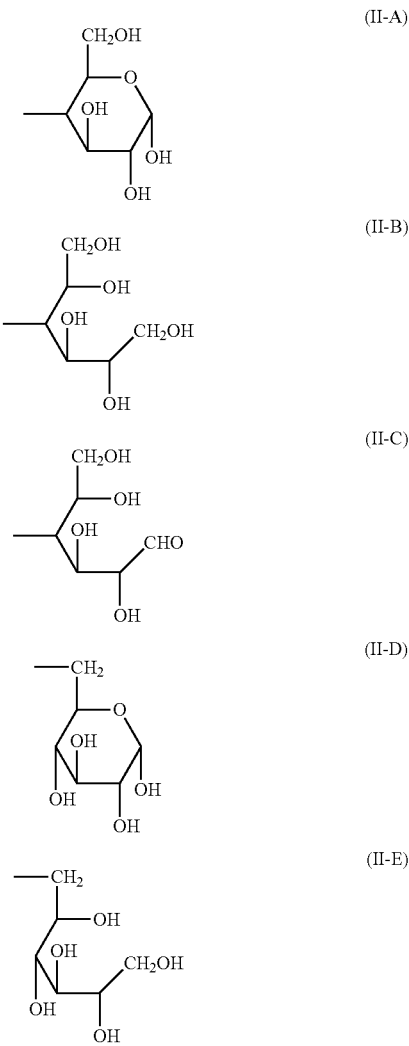

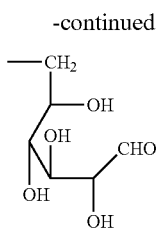

(II-F)

From the viewpoint of polishing the resin at a further favorable polishing rate, the degree of polymerization of α-glucose is 2 or more, preferably 3 or more, and more preferably 5 or more. The upper limit of the degree of polymerization of α-glucose is not limited in particular.

Incidentally, in the present specification, the "degree of polymerization of α-glucose" is defined as the number of structural units in one molecule, which are derived from α-glucose, and for instance, it is the total number of the structural units, in one molecule, which are represented by the formula (I-A), the formula (I-B) and the formulae (II-A) to (II-F).

Examples of the polyalkylene glycols include polyethylene glycol and polypropylene glycol. Examples of the glycerol fatty acid esters include glyceryl stearate, glyceryl hydroxystearate, polyglyceryl distearate, polyglyceryl di-isostearate, di-glyceryl tri-isostearate, polyglyceryl mono-isostearate, di-glyceryl tetra-isostearate, polyglyceryl oleate, polyglyceryl dioleate, polyglyceryl cocoate, polyglyceryl di-cocoate, polyglyceryl tri-cocoate, polyglyceryl sesquistearate, polyglyceryl sesquicaprylate, glyceryl tri-2-ethylhexanoate, glyceryl tri(capryl-capric acid), polyglyceryl laurate and polyglyceryl isononanoate. Examples of the aromatic glycol ethers include polyethylene glycol monobenzyl ether. Examples of the aliphatic glycol ethers include N-polyoxypropylene ethylenediamine. Examples of the ester-based glycol ethers include polyethylene glycol methacrylate, polyethylene glycol methacrylate, and polyethylene glycol monomethyl ether methacrylate. Examples of the propylene oxide adducts include trimethylolpropane tripolyoxyethylene ether, trimethylolpropane tripolyoxypropylene ether, and trimethylolpropane. Examples of the gallic acid glycosides include gallic acid 3-glucoside and gallic acid-3,5-diglucoside. Examples of the glycosides of phenols include salicylic acid glucoside and hydroxybenzoic acid glucoside. Examples of the glycosides of polyphenols include tannic acid glucoside, proanthocyanidin glucoside, catechin glucoside, rutinic acid glucoside, cacao mass glucoside and isoflavone glucoside. Examples of the ester compounds of sugar include polyoxyethylene sorbit fatty acid esters, polyoxyethylene pentaerythritol fatty acid esters, and polyoxyethylene sorbitan fatty acid esters.

The water-soluble polymer having the ether bond is preferably at least one selected from the group consisting of polyoxypropylene polyglyceryl ether, polyoxyethylene polyglyceryl ether, polyglycerin and dextrin, from the viewpoint of being capable of removing the resin at a further favorable polishing rate.

The water-soluble polymer having the ether bond can be used singly or in combinations of two or more.

The weight average molecular weight (Mw) of the water-soluble polymer having the ether bond is preferably 200 or more, more preferably 1000 or more, and further preferably 4000 or more, from the viewpoint that the polishing rate for a resin easily enhances. The weight average molecular weight of the water-soluble polymer having the ether bond is preferably 1000000 or less, more preferably 800000 or less, and further preferably 500000 or less, from the viewpoint that favorable storage stability is obtained.

The weight average molecular weight (Mw) of the water-soluble polymer having the ether bond can be measured by using, for instance, gel permeation chromatography (GPC: Gel Permeation Chromatography), under the following conditions.

[Conditions]

Sample: 20 µL

Standard polyethylene glycol: Standard polyethylene glycol (molecular weight: 106, 194, 440, 600, 1470, 4100, 7100, 10300, 12600 and 23000) made by Polymer Laboratories Co., Ltd.

Detector: RI-monitor, trade name "Syodex-RI SE-61" made by Showa Denko KK.

Pump: trade name "L-6000" made by Hitachi, Ltd.

Column: trade names "GS-220 HQ" and "GS-620 HQ", which were made by Showa Denko KK, were connected in this order and used.

Eluent: 0.4 mol/L aqueous solution of sodium chloride

Measurement temperature: 30° C.

Flow rate: 1.00 mL/min

Measurement time: 45 min

The content of the water-soluble polymer having the ether bond is preferably 0.001 mass % or more, more preferably 0.005 mass % or more, further preferably 0.01 mass % or more, particularly preferably 0.1 mass % or more, extremely preferably 0.2 mass % or more, and very preferably 0.3 mass % on the basis of the total mass of the polishing agent, from the viewpoint that the polishing rate for a resin easily enhances. The content of the water-soluble polymer having the ether bond is preferably 5.00 mass % or less, more preferably 2.00 mass % or less, further preferably 1.00 mass % or less, and particularly preferably 0.5 mass % or less on the basis of the total mass of the polishing agent, from the viewpoint that the favorable storage stability is easily obtained.

(Organic Solvent)

The polishing agent of the present embodiment comprises an organic solvent. Because the polishing agent comprises the organic solvent, it is possible to enhance the polishing rate for a resin and the wettability of the polishing agent. The organic solvent is not limited in particular, but a solvent in a liquid state at 20° C. is preferable. The solubility of the organic solvent for 100 g of water (20° C.) is preferably 30 g or more, more preferably 50 g or more, and further preferably 100 g or more, from the viewpoint of highly concentrating the polishing agent. The organic solvent can be used singly or in combinations of two or more.

Examples of the organic solvents include carbonate esters, lactones, glycols, and derivatives of glycols. Examples of the carbonate esters include ethylene carbonate, propylene carbonate, dimethyl carbonate, diethyl carbonate and methylethyl carbonate. Examples of the lactones include butyrolactone and propiolactone. Examples of the glycols include ethylene glycol, propylene glycol, diethylene glycol, dipropylene glycol, triethylene glycol and tripropylene glycol. Examples of the derivatives of the glycols include glycol monoethers and glycol diethers. Examples of the glycol monoethers include ethylene glycol monomethyl ether, propylene glycol monomethyl ether, propylene glycol monomethyl ether acetate, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether. Examples of the glycol diethers include ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether. The organic solvent is preferably at least one selected from the group consisting of glycols and derivatives of the glycols, from the viewpoint that surface tension is low, and more preferably glycol monoethers, from the viewpoint that the surface tension is further low.

The content of the organic solvent is preferably 0.500 mass % or more, more preferably 1.000 mass % or more, further preferably 2.000 mass % or more, particularly preferably 3.000 mass % or more, and extremely preferably 5.000 mass % or more on the basis of the total mass of the polishing agent, from the viewpoint of suppressing the lowering of the wettability of the polishing agent with respect to a resin. The content of the organic solvent is preferably 20.000 mass % or less, more preferably 15.000 mass % or less, and further preferably 10.000 mass % or less on the basis of the total mass of the polishing agent, from the viewpoint that the dispersion stability is excellent.

(Water)

The polishing agent of the present embodiment comprises water. The water is used as a dispersion medium of other components or as a solvent. As for the water, in order to prevent the inhibition of the action of other components, it is preferable that the water does not contain the impurities as much as possible. Specifically, the water is preferably at least one selected from the group consisting of pure water, ultrapure water and distilled water from which impurity ions are removed by an ion-exchange resin and then foreign substances are removed through a filter.

(Additive)

As additives of the present embodiment, a component other than the abrasive grains, the water-soluble polymer having the ether bond, the organic solvent and the water may be further comprised, for the purposes of enhancing the dispersibility of the abrasive grains in the polishing agent, enhancing the chemical stability of the polishing agent, enhancing the polishing rate, and the like. Examples of such a component include additives such as an acid component, a polishing inhibitor for insulating material, a corrosion preventive agent, an oxidizing agent, a surfactant and an antifoaming agent. The content of the additive in the polishing agent can be arbitrarily determined within such a range as not to impair the characteristics of the polishing agent.

[Acid Component]

The polishing agent of the present embodiment may comprise an acid component. Because the polishing agent of the present embodiment comprises the acid component, it is possible to enhance the liquid state stability of the polishing agent and can successfully flatten the polished surface. In addition, in the case where the wiring metal or the barrier metal in addition to the resin are simultaneously polished, the acid component promotes the dissolution of the wiring metal or the barrier metal, and can enhance the polishing rate for a wiring metal or a barrier metal.

In addition, the pH can be also adjusted by using the acid component. The electric charge of the abrasive grains is adjusted to be positive by adjusting the pH, and thereby it is possible to easily obtain the favorable polishing rate with respect to a resin.

The acid component is preferably at least one selected from the group consisting of an organic acid component and an inorganic acid component, from the viewpoint of being capable of further enhancing the dispersibility and stability of the aqueous dispersion, and the polishing rates for the resin, the wiring metal and the barrier metal.

Examples of the organic acid components include organic acids (excluding amino acid), organic acid esters, organic acid salts and amino acids. Examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, 3-methylphthalic acid, 4-methylphthalic acid, 3-aminophthalic acid, 4-aminophthalic acid, 3-nitrophthalic acid, 4-nitrophthalic acid, glutaric acid, adipic acid, pimelic acid, maleic acid, phthalic acid, isophthalic acid, malic acid, tartaric acid, citric acid, p-toluenesulfonic acid, p-phenolsulfonic acid, methylsulfonic acid, lactic acid, itaconic acid, maleic acid, quinaldic acid, adipic acid and pimelic acid. Examples of the organic acid esters include esters of the above-described organic acids. Examples of the organic acid salts include ammonium salts, alkali metal salts, alkaline earth metal salts and halides of the above-described organic acids. Examples of the amino acids include alanine, arginine, asparagine, aspartic acid, cysteine, glutamine, glutamic acid, glycine, histidine, isoleucine, leucine, lysine, methionine, phenylalanine, proline, serine, threonine, tryptophan, tyrosine and valine.

Examples of the inorganic acid components include inorganic acids, ammonium salts of the inorganic acids, ammonium persulfate, ammonium nitrate, ammonium chloride and chromic acids. Examples of the inorganic acids include hydrochloric acid, sulfuric acid and nitric acid.

In the case where the substrate to be polished is, for instance, a silicon substrate containing an element for an integrated circuit, contamination with an alkali metal, an alkaline earth metal, a halide or the like is undesirable, and accordingly the salt of the above-described acid component is preferably a salt other than the alkali metal salts, the alkaline earth salts and the halides.

The acid component is preferably at least one selected from the group consisting of malonic acid, malic acid, tartaric acid, citric acid, salicylic acid, adipic acid, phthalic acid, glycolic acid and succinic acid, from the viewpoint of effectively suppressing an etching rate while keeping a practical polishing rate. The acid component can be used singly or in combinations of two or more.

The content of the acid component is preferably 0.001 mass % or more, more preferably 0.002 mass % or more, and further preferably 0.005 mass % or more on the basis of the total mass of the polishing agent, from the viewpoint of being capable of obtaining the favorable polishing rates for the resin, the wiring metal and the barrier metal. The content of the acid component is preferably 20 mass % or less, more preferably 10 mass % or less, and further preferably 5 mass % or less on the basis of the total mass of the polishing agent, from the viewpoint of easily suppressing etching and decreasing the roughening of the polished surface.

[Polishing Inhibitor for Insulating Material]

The polishing agent of the present embodiment may comprise a polishing inhibitor for insulating material (component of polishing inhibitor for insulating material, for instance, inorganic insulating-film polishing inhibitor) as a component for suppressing the polishing of an insulating material. By comprising the polishing inhibitor for insulating material, the polishing agent can suppress the polishing rate for an insulating material and can selectively remove a resin with respect to an insulating material.

Examples of the polishing inhibitor for insulating material include an allylamine-based polymer. In the present specification, the "allylamine-based polymer" is defined as a polymer having a structural unit obtained by the polymerization of monomers containing an allylamine-based compound. In the present specification, the "allylamine-based compound" is defined as a compound having an allyl group and an amino group. The allylamine-based polymer may have a structural unit obtained by the polymerization of only allylamine-based compounds, and may have a structural unit obtained by the copolymerization of the allylamine-based compound and a compound other than the allylamine-based compound. The polishing inhibitor for insulating material can be used singly or in combinations of two or more.

The allylamine-based polymer preferably has at least one selected from the group consisting of a structural unit represented by the following general formula (III), a structural unit represented by the following general formula (IV), a structural unit represented by the following general formula (V), a structural unit represented by the following general formula (VI) and a structural unit represented by the following general formula (VII), in a molecule of the polymer, from the viewpoint of further selectively removing a resin with respect to an insulating material.

[Chemical formula 3]

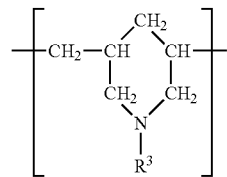
(III)

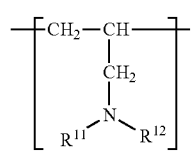
(IV)

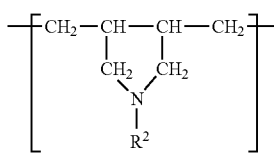
(V)

[In the formulae, $R^{11}$, $R^{12}$, $R^2$ and $R^3$ each independently represent a hydrogen atom, an alkyl group or an aralkyl group, the alkyl group and the aralkyl group may have a hydroxyl group, the amino group and the nitrogen-containing ring may each independently form an acid addition salt, and $R^{11}$ and $R^{12}$ may be the same as or different from each other.]

[Chemical formula 4]

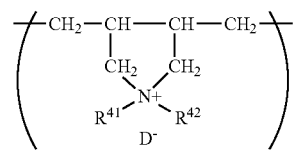
(VI)

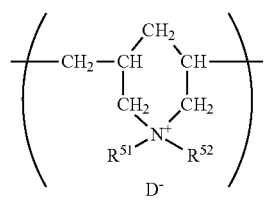
(VII)

[In the formulae, $R^{41}$ and $R^{42}$ each independently represent an alkyl group or an aralkyl group, the alkyl group and the aralkyl group may have a hydroxyl group, $R^{51}$ and $R^{52}$ each independently represent an alkyl group or an aralkyl group, and $D^-$ represents a monovalent anion. $R^{41}$ and $R^{42}$ may be the same as or different from each other. $R^{51}$ and $R^{52}$ may be the same as or different from each other.]

As the structural unit contained in the allylamine-based polymer, the structural units that are represented by the general formulae (III) to (VII) may be a single structural unit, or may be two or more structural units. The total number of the structural units represented by the general formulae (III) to (VII) in a molecule is preferably 5 or more, more preferably 7 or more, and further preferably 10 or more, from the viewpoint of easily suppressing the polishing rate for an insulating material. Here, the total number of the structural units represented by the general formulae (III) to (VII) in a molecule is an average value of the allylamine-based polymers comprised in the polishing agent.

The alkyl groups of $R^{11}$, $R^{12}$, $R^2$ and $R^3$ in the general formulae (III), (IV) and (V) may be any of a linear form, a branched form and a cyclic form. The number of carbon atoms in the alkyl group is preferably 1 or more, from the viewpoint of easily suppressing the polishing rate for an insulating material. The number of the carbon atoms in the alkyl group is preferably 10 or less, more preferably 7 or less, further preferably 5 or less, and particularly preferably 4 or less, from the viewpoint of easily suppressing the polishing rate for an insulating material.

The alkyl groups corresponding to $R^{11}$, $R^{12}$, $R^2$ and $R^3$ may each have a hydroxyl group. Examples of the alkyl groups corresponding to $R^{11}$, $R^{12}$, $R^2$ and $R^3$ include a methyl group, an ethyl group, an n-propyl group, an isopropyl group, an n-butyl group, an iso-butyl group, a tert-butyl group, a cyclohexyl group, and hydroxyl group adducts thereof (3-hydroxypropyl group and the like).

The "aralkyl group" refers to a group in which one of the hydrogen atoms in the alkyl group is substituted with an aryl group. Here, the alkyl group constituting the aralkyl groups corresponding to $R^{11}$, $R^{12}$, $R^2$ and $R^3$ in the general formulae (III), (IV) and (V) may be any of a linear form, a branched form and a cyclic form. The number of carbon atoms in the aralkyl group is preferably 7 to 10, from the viewpoint of easily suppressing the polishing rate for an insulating material.

The aralkyl groups corresponding to $R^{11}$, $R^{12}$, $R^2$ and $R^3$ may each have a hydroxyl group. Examples of the aralkyl groups include a benzyl group, a phenethyl group, a phenylpropyl group, a phenylbutyl group, a phenylhexyl group, and hydroxyl group adducts thereof.

The amino group in the general formula (III) and the nitrogen-containing rings in the general formulae (IV) and (V) may form an acid addition salt. Examples of the acid addition salts include hydrochloride, hydrobromide, acetate, sulfate, nitrate, sulfite, phosphate, amide sulfate, and methanesulfonate. Among these, at least one selected from the group consisting of hydrochloride, acetate and amidosulfate is preferably, from the viewpoint that a higher ratio of the polishing rate for a resin with respect to an insulating material is obtained.

Among the above-described compounds, $R^{11}$, $R^{12}$, $R^2$ and $R^3$ is preferably at least one selected from the group consisting of a hydrogen atom, a methyl group and an ethyl group from the viewpoint of being excellent in wettability with an insulating material (for instance, silicon oxide).

Among the allylamine-based polymers having the structural units represented by the general formula (III), (IV) or (V), at least one selected from the group consisting of the allylamine polymer and the diallylamine polymer is preferably, from the viewpoint that a higher polishing selection ratio of a resin with respect to an insulating material is obtained. From the same viewpoint, the structural unit containing the acid addition salt is preferably at least one selected from the group consisting of diallylamine hydrochloride, methyldiallylamine hydrochloride, ethyldiallylamine hydrochloride, methyldiallylamine acetate, and methyldiallylamineamide sulfate.

The alkyl groups corresponding to $R^{41}$, $R^{42}$, $R^{51}$ and $R^{52}$ in the general formulae (VI) and (VII) may be any of a linear form, a branched form and a cyclic form. The number of carbon atoms in the alkyl groups corresponding to $R^{41}$ and $R^{42}$ is preferably 1 or more, from the viewpoint of easily suppressing the polishing rate for an insulating material. The number of the carbon atoms in the alkyl group corresponding to $R^{41}$ and $R^{42}$ is preferably 10 or less, more preferably 7 or less, and further preferably 4 or less, from the viewpoint of easily suppressing the polishing rate for an insulating material. The number of carbon atoms in the alkyl groups corresponding to $R^{51}$ and $R^{52}$ is preferably 1 or more, from the viewpoint of easily suppressing the polishing rate for an insulating material. The number of the carbon atoms in the alkyl group corresponding to $R^{51}$ and $R^{52}$ is preferably 10 or less, more preferably 7 or less, and further preferably 4 or less, from the viewpoint of easily suppressing the polishing rate for an insulating material.

The alkyl groups corresponding to $R^{41}$ and $R^{42}$ may each have a hydroxyl group. Examples of the alkyl groups corresponding to $R^{41}$ and $R^{42}$ include a methyl group, an ethyl group, an n-propyl group, an isopropyl group, an n-butyl group, an iso-butyl group, a tert-butyl group, a cyclohexyl group, and hydroxyl group adducts thereof (3-hydroxypropyl group and the like).

Examples of the alkyl groups corresponding to $R^{51}$ and $R^{52}$ include a methyl group, an ethyl group, an n-propyl group, an isopropyl group, an n-butyl group, an iso-butyl group, a tert-butyl group and a cyclohexyl group.

The alkyl groups constituting the aralkyl groups corresponding to $R^{41}$, $R^{42}$, $R^{51}$ and $R^{52}$ in the general formulae (VI) and (VII) may be any of a linear form, a branched form and a cyclic form. The number of carbon atoms in the aralkyl group is preferably 7 to 10, from the viewpoint of easily suppressing the polishing rate for an insulating material.

The aralkyl groups corresponding to $R^{41}$ and $R^{42}$ may each have a hydroxyl group. Examples of the aralkyl groups include a benzyl group, a phenethyl group, a phenylpropyl group, a phenylbutyl group, and hydroxyl group adducts thereof.

Examples of the aralkyl groups corresponding to $R^{51}$ and $R^{52}$ include a benzyl group, a phenethyl group, a phenylpropyl group and a phenylbutyl group.

Among the above-described groups, $R^{41}$, $R^{42}$, $R^{51}$ and $R^{52}$ are preferably at least one functional group selected from the group consisting of the methyl group, the benzyl group and the phenethyl group, from the viewpoint of being excellent in wettability with an insulating material (for instance, silicon oxide).

Examples of $D^-$ in the general formulae (VI) and (VII) include halogen ions such as $Cl^-$, $Br^-$ and $I^-$; and alkyl sulfate ions such as a methyl sulfate ion, an ethyl sulfate ion and a dimethyl sulfate ion.

Examples of a partial structure represented by the following general formula (VIa) in the general formula (VI) and a partial structure represented by the following general formula (VIIa) in the general formula (VII) include N,N-dialkylammonium salts and N-alkyl-N-benzyl ammonium salts. Examples of the N,N-dialkylammonium salts include N,N-dialkylammonium halides and N,N-dialkylammonium alkyl sulfates. Examples of the N,N-dialkylammonium halides include N,N-dimethylammonium halides, N,N-diethylammonium halides, N,N-dipropylammonium halides, and N,N-dibutylammonium halides. Examples of the N,N-dialkylammonium alkyl sulfates include N,N-dimethylammonium methyl sulfate and N,N-methylethylammonium ethyl sulfate. Examples of the N-alkyl-N-benzylammonium salts include N-alkyl-N-benzylammonium halides such as N-methyl-N-benzylammonium halides and N-ethyl-N-benzylammonium halides. Examples of the halides of the above-described partial structure include chloride, bromide and iodide. Among structural units having these partial structures, at least one selected from the group consisting of N,N-dimethylammonium chloride and N,N-methylethylammonium ethyl sulfate is preferably, from the viewpoint that a higher ratio of the polishing rate for a resin with respect to an insulating material is obtained.

[Chemical formula 5]

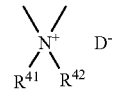

(VIa)

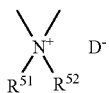
(VIIa)

The allylamine polymer may have a structure obtained by the copolymerization of an allylamine-based compound and a compound other than the allylamine-based compound. For instance, the allylamine-based polymer may have a structure obtained by the copolymerization of a monomer which gives at least one structural unit selected from the group consisting of a structural unit represented by the general formula (III), a structural unit represented by the general formula (IV) and a structural unit represented by the general formula (V), and a monomer other than the allylamine-based compound.

The allylamine-based polymer may have at least one selected from the group consisting of a structural unit represented by the following general formula (VIII), a structural unit represented by the following formula (IX), a structural unit represented by the following general formula (X) and a structural unit represented by the following general formula (XI). For instance, the allylamine-based polymer may have: at least one structural unit selected from the group consisting of the structural unit represented by the general formula (III), the structural unit represented by the general formula (IV), the structural unit represented by the general formula (V), the structural unit represented by the general formula (VI), and the structural unit represented by the general formula (VII); and at least one structural unit selected from the group consisting of the structural unit represented by the general formula (VIII), the structural unit represented by the formula (IX), the structural unit represented by the general formula (X), and the structural unit represented by the general formula (XI).

[Chemical formula 6]

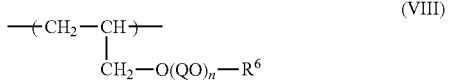
(VIII)

[In the formula (VIII), Q represents an alkylene group, $R^6$ represents a hydrogen atom or an alkyl group, and n represents an average number of addition moles of 0 to 30.]

[Chemical formula 7]

(IX)

[Chemical formula 8]

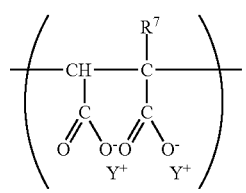
(X)

[In the formula (X), $R^7$ represents a hydrogen atom or an alkyl group, and $Y^+$ represents a cation.]

[Chemical formula 9]

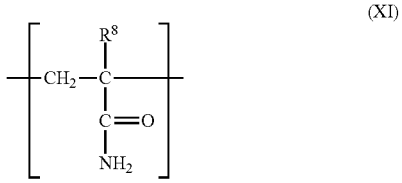
(XI)

[In the formula (XI), $R^8$ represents a hydrogen atom or an alkyl group.]

When n is 0, examples of the monomers which give the structural unit represented by the general formula (VIII) include allyl alcohols. When n is 1 to 30, examples of the monomers which give the structural unit represented by the general formula (VIII) include (poly)oxyalkylene monoallyl ethers and (poly)oxyalkylene monoallyl monomethyl ethers. In this case, the alkylene group represented by Q is preferably a straight-chain or branched-chain alkylene group having 2 to 3 carbon atoms, and more preferably at least one selected from the group consisting of an ethylene group, a trimethylene group and a propylene group, from the viewpoint of easily suppressing the polishing rate for an insulating material. The alkylene group may be introduced singly, or two or more may be introduced in combinations. $R^6$ is preferably at least one selected from the group consisting of a hydrogen atom and a methyl group, from the viewpoint of easily suppressing the polishing rate for an insulating material.

The allylamine-based polymer having the structural unit represented by the general formula (VIII) is preferably a diallylmethylamine hydrochloride/allyl alcohol copolymer, from the viewpoint that a ratio of the polishing rate for a resin with respect to an insulating material further enhances.

Examples of the monomer which gives the structural unit represented by the formula (IX) include sulfur dioxide. The allylamine-based polymers having the structural unit represented by the formula (IX) is preferably a diallylamine hydrochloride/sulfur dioxide copolymer, from the viewpoint that a higher ratio of the polishing rate for a resin with respect to an insulating material is obtained.

$R^7$ in the general formula (X) is preferably at least one selected from the group consisting of a hydrogen atom and a methyl group, and more preferably a hydrogen atom, from the viewpoint of easily suppressing the polishing rate for an insulating material. Examples of $Y^+$ include alkali metal ions such as a sodium ion and a potassium ion; a hydrogen ion; and an ammonium ion.

Examples of monomers which give the structural unit represented by the general formula (X) include maleic acid, fumaric acid, citraconic acid, itaconic acid, mesaconic acid and 2-allylmalonic acid, and among these, the maleic acid is preferable from the viewpoint of easily decreasing the polishing rate for an insulating material and the viewpoint that the dispersibility of the allylamine-based polymer in the polishing agent is favorable.

The allylamine-based polymer having the structural unit represented by the general formula (X) is preferably at least one selected from the group consisting of a diallylamine hydrochloride/maleic acid copolymer and a diallylamine amido sulfate/maleic acid copolymer, from the viewpoint that a higher ratio of the polishing rate for a resin with respect to an insulating material is obtained.

$R^8$ in the general formula (XI) is preferably at least one selected from the group consisting of a hydrogen atom and a methyl group, and more preferably a hydrogen atom, from the viewpoint of easily suppressing the polishing rate for an insulating material. Examples of monomers which give the structural unit represented by the general formula (XI) include acrylamide.

The allylamine-based polymer having the structural unit represented by the general formula (XI) is preferably at least one selected from the group consisting of a diallylmethylammonium chloride/acrylamide copolymer and a diallyldimethylammonium chloride/acrylamide copolymer, from the viewpoint that a higher ratio of the polishing rate for a resin with respect to an insulating material is obtained.

The allylamine-based polymer is preferably at least one selected from the group consisting of a methyldiallylamine amide sulfate polymer, an allylamine polymer, a diallyldimethylammonium chloride/acrylamide copolymer and a diallylamine hydrochloride/sulfur dioxide copolymer, from the viewpoint that a higher ratio of the polishing rate for a resin with respect to an insulating material is obtained.

The weight average molecular weight (Mw) of the polishing inhibitor for insulating material (allylamine-based polymer and the like) is preferably 500 or more, more preferably 800 or more, and further preferably 1000 or more, from the viewpoint of easily suppressing the polishing rate for an insulating material. The weight average molecular weight of the polishing inhibitor for insulating material (allylamine-based polymer and the like) is preferably 300000 or less, more preferably 200000 or less, and further preferably 150000 or less, from the viewpoint that excessive increase in viscosity is suppressed and consequently favorable storage stability is obtained. The weight average molecular weight of the polishing inhibitor for insulating material (allylamine-based polymer and the like) can be measured by using GPC on the same conditions as those for measuring the weight average molecular weight of the water-soluble polymer having the ether bond.

The content of the polishing inhibitor for insulating material is preferably 0.001 mass % or more, more preferably 0.003 mass % or more, further preferably 0.004 mass % or more, and particularly preferably 0.005 mass % or more on the basis of the total mass of the polishing agent, from the viewpoint of easily suppressing the polishing rate for an insulating material. The content of the polishing inhibitor for insulating material is preferably 0.400 mass % or less, more preferably 0.300 mass % or less, further preferably 0.200 mass % or less, and particularly preferably 0.100 mass % or less on the basis of the total mass of the polishing agent, from the viewpoint of easily suppressing the lowering of the polishing rate for a resin and easily keeping the high ratio of the polishing rate for a resin with respect to an insulating material.

The mass ratio (polishing inhibitor for insulating material/abrasive grain) of the content of the polishing inhibitor for insulating material with respect to the content of the abrasive grain is preferably 0.002 or more, more preferably 0.003 or more, and further preferably 0.005 or more, from the viewpoint that it is easy to selectively remove the resin with respect to an insulating material. The mass ratio of the content of the polishing inhibitor for insulating material with respect to the content of the abrasive grain is preferably 0.400 or less, more preferably 0.300 or less, and further preferably 0.200 or less, from the viewpoint of easily removing the resin at a favorable polishing rate.

[Corrosion Preventive Agent]

The polishing agent of the present embodiment may comprise a corrosion preventive agent (corrosion preventive agent component, metal corrosion preventive agent). The corrosion preventive agent is not limited in particular, and it is possible to use any conventionally known component as a compound having a corrosion preventive effect against a metallic material. As corrosion preventive agents, specifically, it is possible to use at least one selected from the group consisting of a triazole compound, a pyridine compound, a pyrazole compound, a pyrimidine compound, an imidazole compound, a guanidine compound, a thiazole compound, a tetrazole compound, a triazine compound and hexamethylenetetramine. Here, the term "compound" is a collective term for compounds having a skeleton thereof, and for instance, the "triazole compound" means a compound having a triazole skeleton. The corrosion preventive agent is preferably the triazole compound having a triazole skeleton. The corrosion preventive agent can be used singly or in combinations of two or more.

Examples of the triazole compounds include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxy-1H-benzotriazole, 4-carboxy-1H-benzotriazole methyl ester (methyl 1H-benzotriazole-4-carboxylate), 4-carboxy-1H-benzotriazole butyl ester (butyl 1H-benzotriazole-4-carboxylate), 4-carboxy-1H-benzotriazole octyl ester (octyl 1H-benzotriazole-4-carboxylate), 5-hexylbenzotriazole, [1,2,3 -benzotriazolyl-1-methyl] [1,2,4-triazolyl-1-methyl] [2-ethylhexyl]amine, tolyltriazole, naphthotriazole, bis[(1-benzotriazolyl)methyl]phosphonic acid, 3H-1,2,3-triazolo[4,5-b]pyridin-3-ol, 1H-1,2,3 -triazolo[4,5-b]pyridine, 1-acetyl-1H-1,2,3-triazolo [4,5-b]pyridine, 1,2,4-triazolo[1,5-a]pyrimidine, 2-methyl-5,7-diphenyl-[1,2,4]triazolo[1,5-a]pyrimidine, 2-methylsulfanyl-5,7-diphenyl-[1,2,4]triazolo[1,5-a]pyrimidine, and 2-methylsulfanyl-5,7-diphenyl-4,7-dihydro-[1,2,4]triazolo[1,5-a]pyrimidine. Incidentally, the compounds having a triazole skeleton and another skeleton in one molecule shall be classified into the triazole compound.

Examples of the pyridine compounds include 8-hydroxyquinoline, protionamide, 2-nitropyridin-3-ol, pyridoxamine, nicotinamide, iproniazid, isonicotinic acid, benzo[f]quinoline, 2,5 -pyridinedicarboxylic acid, 4-styrylpyridine, anabasine, 4-nitropyridine-1-oxide, ethyl 3-pyridylacetate, quinoline, 2-ethylpyridine, quinolinic acid, citrazinic acid, pyridine-3-methanol, 2-methyl-5-ethylpyridine, 2-fluoropyridine, pentafluoropyridine, 6-methylpyridin-3-ol, ethyl 2-pyridylacetate, and 3-hydroxypyridine.

Examples of the pyrazole compounds include pyrazole, 1-allyl-3,5-dimethylpyrazole, 3,5-di(2-pyridyl)pyrazole, 3,5-diisopropylpyrazole, 3,5-dimethyl-1-hydroxymethylpyrazole, 3,5-dimethyl-1-phenylpyrazole, 3,5-dimethylpyrazole, 3-amino-5-hydroxypyrazole, 4-methylpyrazole, N-methylpyrazole, 3-aminopyrazole, and 3-aminopyrazole.

Examples of the pyrimidine compounds include pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, 4-aminopyrazolo[3,4-d]pyrimidine, and 1,3,4,6,7,8-hexahydro-2H-pyrimido[1,2-a]pyrimidine. Incidentally, the compounds having a pyrimidine skeleton and another skeleton (excluding triazole skeleton) in one molecule shall be classified into the pyrimidine compound.

Examples of the imidazole compounds include 1,1'-carbonylbis-1H-imidazole, 1,1'-oxalyldiimidazole, 1,2,4,5-tetramethylimidazole, 1,2-dimethyl-5-nitroimidazole, 1,2-dimethylimidazole, 1-(3-aminopropyl)imidazole, 1-butylimidazole, 1-ethylimidazole, 1-methylimidazole, and benzimidazole.

Examples of the guanidine compounds include 1,1,3,3-tetramethylguanidine, 1,2,3-triphenylguanidine, 1,3-di-o-tolylguanidine, and 1,3-diphenylguanidine.

Examples of the thiazole compounds include 2-mercaptobenzothiazole and 2,4-dimethylthiazole.

Examples of the tetrazole compounds include tetrazole, 5-methyltetrazole, 5-amino-1H-tetrazole, and 1-(2-dimethylaminoethyl)-5-mercaptotetrazole Examples of the triazine compounds include 3,4-dihydro-3-hydroxy-4-oxo-1,2,4-triazine.

The content of the corrosion preventive agent is preferably 0.001 mass % or more, more preferably 0.01 mass % or more, further preferably 0.02 mass % or more, particularly preferably 0.05 mass % or more, and extremely preferably 0.1 mass % or more on the basis of the total mass of the polishing agent, from the viewpoint of being capable of suppressing the corrosion and surface roughening of a metallic material. The content of the corrosion preventive agent is preferably 10 mass % or less, more preferably 5.0 mass % or less, further preferably 0.5 mass % or less, and particularly preferably 0.3 mass % or less on the basis of the total mass of the polishing agent, from the viewpoint of being capable of obtaining a favorable polishing rate for a metallic material.

By forming a protective film on a wiring metal such as a copper-based metal or a cobalt-based metal, the corrosion preventive agent suppresses the etching of the wiring metal and can easily reduce roughening of the polished surface.

From the viewpoint of suitably obtaining such an effect, the corrosion preventive agent is preferably at least one selected from the group consisting of a triazole compound, a pyridine compound, an imidazole compound, a tetrazole compound, a triazine compound and hexamethylenetetramine, and more preferably at least one selected from the group consisting of 3H-1,2,3-triazolo [4,5-b]pyridin-3-ol, 1-hydroxybenzotriazole, 1H-1,2,3 -triazolo[4,5-b]pyridine, benzotriazole, 3-hydroxypyridine, benzimidazole, 5-amino-1H-tetrazole, 3,4-dihydro-3-hydroxy-4-oxo-1,2,4-triazine and hexamethylenetetramine.

The mass ratio (acid component/corrosion preventive agent) of the content of the acid component with respect to the content of the corrosion preventive agent in the polishing agent is preferably in a range of 10/1 to 1/5, more preferably in a range of 7/1 to 1/5, further preferably in a range of 5/1 to 1/5, and particularly preferably in a range of 5/1 to 1/1, from the viewpoint of successfully controlling the etching rate and the polishing rate.

[Oxidizing Agent]

The polishing agent of the present embodiment may comprise an oxidizing agent (oxidizing agent component, metal oxidizing agent). By comprising the oxidizing agent, the polishing agent can enhance the polishing rate for a metallic material (wiring metal, barrier metal and the like; for instance, metal layer). The oxidizing agent is not limited in particular, and can be appropriately selected from commonly used oxidizing agents. Specifically, examples of the oxidizing agents include hydrogen peroxide, peroxosulfate, potassium periodate, hypochlorous acid and ozone water; and among them, the hydrogen peroxide is preferable. Incidentally, a nitric acid which is the above-described acid component may be used as the oxidizing agent. The oxidizing agent can be used singly or in combinations of two or more.

The content of the oxidizing agent is preferably 0.01 mass % or more, more preferably 0.05 mass % or more, further preferably 0.07 mass % or more, particularly preferably 0.09 mass % or more, and extremely preferably 0.1 mass % or more on the basis of the total mass of the polishing agent, from the viewpoint of suppressing insufficient oxidation of a metallic material for suppressing the lowering of the polishing rate for a metallic material. The content of the oxidizing agent is preferably 10 mass % or less, more preferably 8 mass % or less on the basis of the total mass of the polishing agent, from the viewpoint of being capable of suppressing roughening of the surface to be polished and achieving small dishing. Incidentally, in the case where an oxidizing agent is used which is generally available as an aqueous solution such as a hydrogen peroxide solution, the content of the oxidizing agent can be adjusted so that the content of the oxidizing agent contained in the aqueous solution is within the above-described range in the polishing agent.

(pH Adjusting Agent and pH of Polishing Agent)

The pH of the polishing agent of the present embodiment is preferably 1.0 or more, more preferably 1.5 or more, further preferably 2.0 or more, particularly preferably 2.3 or more, and extremely preferably 2.5 or more, from the viewpoint that sufficient mechanical polishing force is easily obtained and the polishing rate for a resin further enhances. The pH of the polishing agent is preferably 8.0 or less, more preferably 5.0 or less, further preferably 4.0 or less, and particularly preferably 3.5 or less, from the viewpoint that the favorable dispersion stability of the abrasive grains is obtained. The pH shall be defined as pH at a liquid temperature of 25° C.

The polishing agent of the present embodiment may comprise a pH adjusting agent (pH adjusting agent component). By using the pH adjusting agent, the pH of the polishing agent can be easily adjusted. Examples of the pH adjusting agent include base components such as ammonia, sodium hydroxide, potassium hydroxide, and TMAH (tetramethylammonium hydroxide). Incidentally, the pH of the polishing agent can be also adjusted by the above-described acid component or the like.

The pH of the polishing agent can be measured with a pH meter which uses a general glass electrode. Specifically, for instance, trade name: Model (F-51) made by Horiba, Ltd. can be used. The measurement value of pH is obtained by; after 3-point calibration of a pH meter using phthalate pH standard solution (pH 4.01), a neutral phosphate pH standard solution (pH 6.86) and a borate pH standard solution (pH 9.18) as pH standard solutions, placing the pH meter electrode in the polishing agent, and then measuring the value after at least 2 minutes passed for stabilization. At this time, the liquid temperatures of the standard buffer solution and the polishing agent are 25° C., for instance.

[Surfactant]

The polishing agent may comprise a surfactant (surfactant component). Examples of the surfactants include a water-soluble anionic surfactant, a water-soluble nonionic surfactant, and a water-soluble cationic surfactant. Examples of the water-soluble anionic surfactants include ammonium lauryl sulfate, ammonium polyoxyethylene lauryl ether sulfate, alkyl phosphates, polyoxyethylene alkyl ether phosphates, and a lauroyl sarcosinate. Examples of the water-soluble nonionic surfactants include polyoxyethylene lauryl ether, and polyethylene glycol monostearate. Examples of the water-soluble cationic surfactants include a hexadecyltrimethylammonium salt, a myristyltrimethylammonium salt, a lauryltrimethylammonium salt, a stearyltrimethylammonium salt, a cetyltrimethylammonium salt, a stearyltrimethylammonium salt, a distearyldimethylammonium salt, alkylbenzyldimethyl ammonium salts, alkylbenzyldimethylammonium salts, coconut amine acetate, and stearyl amine acetate. Among them, the water-soluble anionic surfactant is preferable as the surfactant. In particular, it is more preferable to use at least one water-soluble anionic surfactant such as a polymer dispersant obtained by using an ammonium salt or a tetramethylammonium salt, as a copolymerization component. The surfactant can be used singly or in combinations of two or more. A content of the surfactant is, for instance, 0.0001 to 0.1 mass % on the basis of the total mass of the polishing agent.

A method for mixing each component comprised in the polishing agent and a method for diluting the polishing agent are not limited in particular, and for instance, each component can be dispersed or dissolved by stirring with a blade stirrer, ultrasonic dispersion or the like. The mixing order of each component with respect to water is not limited.

The polishing agent of the present embodiment may be stored as a one-pack type polishing agent containing at least abrasive grains, a water-soluble polymer having an ether bond, an organic solvent and water, and may be stored as a multi-pack polishing agent having a slurry (first liquid) and an additive liquid (second liquid). In the multi-pack polishing agent, the components of the above-described polishing agent are divided into the slurry and the additive liquid so that the slurry and the additive liquid are mixed to form the above-described polishing agent. The slurry contains at least abrasive grains and water, for instance. The additive liquid contains at least the water-soluble polymer having an ether bond, the organic solvent and water, for instance. It is preferable that additives such as the polishing inhibitor for insulating material, the corrosion preventive agent, the oxidizing agent, the surfactant and the antifoaming agent are contained in the additive liquid out of the slurry and the additive liquid. Incidentally, the components of the polishing agent may be stored separately in three or more liquids.

In the multi-pack polishing agent, the polishing agent may be prepared by mixing the slurry and the additive liquid immediately before polishing or during polishing. It is also acceptable to supply each of the slurry and the additive solution in the multi-pack polishing agent onto a polishing platen, and to polish the surface to be polished with the use of the polishing agent obtained by mixing the slurry and the additive liquid on the polishing platen.

<Stock Solution for Polishing Agent>

The stock solution for the polishing agent of the present embodiment is a stock solution for obtaining the above-described polishing agent, wherein the stock solution for the polishing agent is diluted with water to obtain the above-described polishing agent. The stock solution for the polishing agent is stored in such a state that the amount of water is more reduced than that during use, and is used as the above-described polishing agent by being diluted with water before use or during use. The stock solution for the polishing agent is different from the above-described polishing agent in such a point that the content of water is smaller than that in the above-described polishing agent. The dilution ratio is, for instance, 1.5 times or more.

<Polishing Method>

The polishing method of the present embodiment comprises a polishing step of subjecting a base material having a resin to CMP with the use of the polishing agent to remove at least a part of the resin. In the polishing method of the present embodiment, a base material having a resin is polished. The base material has, for instance, the resin formed on the substrate having a concave portion and a convex portion on its surface. The base material may be a wiring board, for instance.

As the polishing step, for instance, the polishing method of the present embodiment may comprise a CMP step of subjecting the base material to CMP with the use of a one-pack type polishing agent to remove at least a part of the resin; a CMP step of subjecting the base material to the CMP with the use of a polishing agent obtained by mixing a slurry and an additive liquid in a multi-pack polishing agent to remove at least a part of the resin; or a CMP step of subjecting the base material to the CMP with the use of a polishing agent obtained by diluting the stock solution for the polishing agent with water to remove at least a part of the resin. In the CMP step, polishing may be stopped, for instance, when a resin has been polished and consequently an insulating material has been exposed.

The polishing method of the present embodiment may comprise a step of preparing a base material having the resin, before the CMP step.

In the case of using the multi-pack polishing agent, the polishing method of the present embodiment may comprise a polishing agent preparation step of mixing the slurry and the additive liquid in the multi-pack polishing agent to obtain the polishing agent, before the CMP step. In the case of using the stock solution for the polishing agent, the polishing method of the present embodiment may comprise a polishing agent preparation step of obtaining the polishing agent by diluting the stock solution for the polishing agent with water, before the CMP step.

In the CMP step, for instance, the surface to be polished of the base material is polished by relatively moving the base material with respect to the polishing platen in such a state that the surface to be polished is pressed against a polishing cloth (polishing pad) of the polishing platen, the polishing agent is supplied between the surface to be polished and the polishing cloth, and a predetermined pressure is applied to the rear face (surface opposite to surface to be polished) of the base material.

As a polishing apparatus, for instance, it is possible to use a general polishing apparatus which has a platen to which a motor that can change the number of revolutions or the like is attached and on which a polishing cloth also can be mounted; and a holder which holds the base material. The polishing cloth is not limited in particular, but a general nonwoven fabric, foamed polyurethane, a porous fluororesin, and the like can be used. The polishing condition is not limited in particular, but the rotational speed of the platen is preferably a low rotation of 200 $min^{-1}$ or less from the viewpoint of suppressing flying-off of the base material. For instance, while polishing, the polishing agent is continuously supplied to the polishing cloth with a pump or the like. The amount of the polishing agent to be supplied is not limited, but it is preferable that the surface of the polishing cloth is always covered with the polishing agent and a product produced by a progress of polishing is continuously discharged.

In order to carry out the CMP while always keeping the surface state of the polishing cloth constant, it is preferable that the polishing method of the present embodiment comprises a conditioning step of a polishing cloth before the CMP step. For instance, the conditioning of the polishing cloth is performed with a liquid containing at least water, while using a dresser to which diamond particles attach. It is preferable that the polishing method of the present embodiment comprises a base material cleaning step after the CMP step. It is preferable to adequately wash the base material after polishing in running water, then perform drying after removing droplets, which have attached onto the base material, with the use of a spin dry or the like. In addition, it is more preferable to clean the base material with a known cleaning method of removing the deposits on the base material by pressing a brush made from polyurethane against the base material with a constant pressure while letting a commercially available cleaning liquid flow on the surface of the base material and rotating the brush, and then dry the base material.

Figure 2:
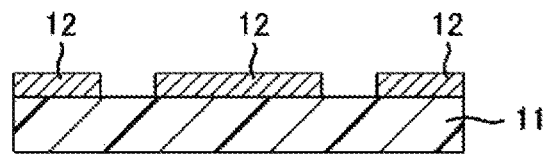
FIG. 2 is a schematic cross-sectional view of a fine pattern forming process.
Figure 2:
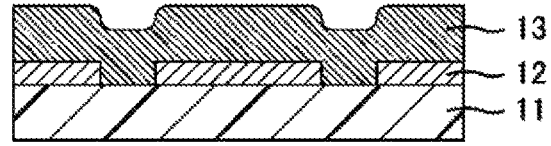
Figure 2:
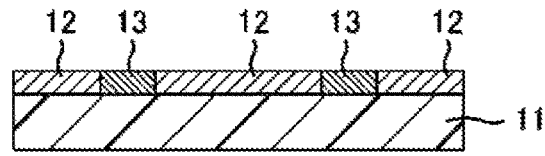
Figure 2:
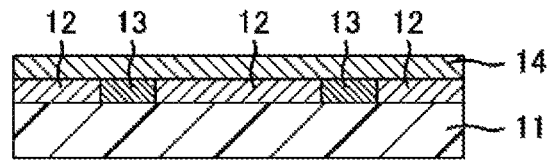
Figure 2:
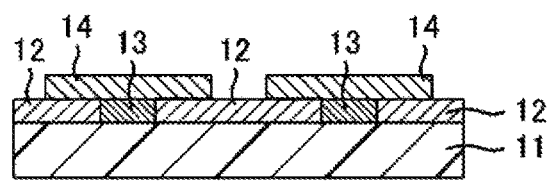
Figure 2:
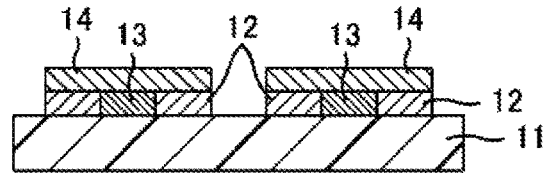
Figure 2:
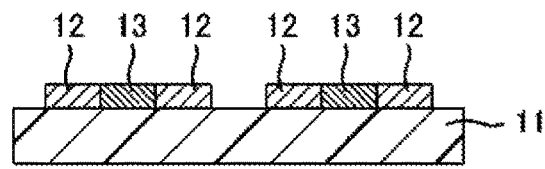
Figure 2:
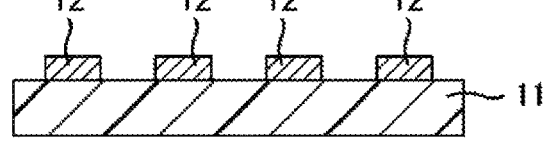

The polishing agent of the present embodiment can remove at least a part of the resin by subjecting the base material having the resin to the CMP. Examples of applications that use such features include a double patterning application. The polishing method of the present embodiment will be described with reference to FIG. 2.

First, a base material is prepared that has a substrate 11, and silicon oxide 12 which has a predetermined pattern and is also formed on the substrate 11 (FIG. 2(a)). A resin 13 is formed by being applied onto the substrate 11 and the silicon oxide 12 and being cured (FIG. 2(b)). A pattern similar to the pattern of the silicon oxide 12 is formed on the surface of the resin 13. Such a resin 13 is generally referred to as a sacrificial film in some cases.

Next, the surface layer portion of the resin 13 is subjected to the CMP until the silicon oxide 12 is exposed to flatten the surface that is composed of the surface of the silicon oxide 12 and the surface of the resin 13 (FIG. 2(c)). The surface of the base material, which has been sufficiently flattened by the CMP process, has few unevenness that is formed when the photoresist is applied; and the depth of focus resists decreasing and the yield also resists decreasing. In addition, it is prevented that the silicon oxide 12 is polished after the silicon oxide 12 has been exposed, and accordingly the surface of the base material can be uniformly finished. Incidentally, after the step of FIG. 2(c), an anti-reflection film (BARC film) may be formed before the photoresist is applied.

Subsequently, the photoresist 14 is uniformly applied onto the surfaces of the silicon oxide 12 and the resin 13 (FIG. 2(d)). Then, the mask pattern is transferred to the photoresist 14 by using an exposure device. After the base material onto which the pattern has been transferred has been subjected to heat treatment, the base material is subjected to processing so as to remove an unnecessary portion of the photoresist 14 (FIG. 2(e)).

Next, a portion of the silicon oxide 12, which is exposed between the photoresists 14, is removed by dry etching which uses a plasmarized gas or the like (FIG. 2(f)). Then, the photoresist 14 is stripped off with the use of a solution and the like, in which ethanolamines and an organic solvent are combined (FIG. 2(g)). Furthermore, the resin 13 is removed by wet etching (FIG. 2(h)). By the above operations, a pattern is formed wherein the pattern has the line and space which is a half of the pitch of the initial pattern of the silicon oxide 12 (FIG. 2(a)).

The polishing rate for a resin is preferably the following polishing rate, from the viewpoint of being suitable for the double patterning application. The polishing rate for a resin is preferably 100 nm/min or more, more preferably 110 run/min or more, further preferably 140 nm/min or more, and particularly preferably 150 nm/min or more, from the viewpoint of shortening the polishing time. The polishing rate for a resin is preferably 1000 nm/min or less, and more preferably 800 nm/min or less, from the viewpoint that the progress of excessive polishing for the concave portion of the resin is suppressed to further enhance the flatness, and the viewpoint that it is easy to adjust the polishing time.

EXAMPLES

The present invention will be described in more detail with reference to examples, but the present invention is not limited to these examples unless deviating from the technological idea of the present invention. For instance, the type and the blending ratio of the materials of the polishing agent may be types and ratios other than the types and the ratios described in the present examples, and the composition and the structure of the object to be polished may also be compositions and structures other than the compositions and the structures described in the present examples.

<Preparation of Polishing Agent>

Example 1

0.300 parts by mass of A1 (polyoxypropylene polyglyceryl ether, made by Sakamoto Yakuhin Kogyo Co., Ltd., trade name: SC-P1000, and weight average molecular weight: 1000) as a water-soluble polymer having an ether bond, 5.000 parts by mass of propylene glycol monopropyl ether as an organic solvent, and malic acid as an acid component were charged into a container. Furthermore, X parts by mass of ultrapure water was poured, and then stirring was performed to dissolve each component. Next, 3.000 parts by mass of colloidal silica 1 having the average particle diameter (average secondary particle diameter) of 70 nm was added to obtain 100 parts by mass of the polishing agent. The surface of the abrasive grain was positively charged in the polishing agent. Incidentally, the amount of X parts by mass of the blended ultrapure water was calculated and adjusted so that the polishing agent became 100 parts by mass. A pH of the polishing agent of Example 1 was 2.5, and a zeta potential of the abrasive grain was 14 mV.

Examples 2 to 18, and Comparative Examples 1 to 5

Polishing agents were prepared in the same manner as in Example 1, except that the types and the contents of the abrasive grains, the water-soluble polymer having the ether bond, the organic solvent and the acid component were changed as shown in Tables 1 to 3. In Example 18, benzotriazole was used as a corrosion preventive agent, and 30 mass % of hydrogen peroxide water was used as an oxidizing agent. The amounts of each of the components in Tables 1 to 3 are contents (unit: mass %) on the basis of the total mass of the polishing agent. Incidentally, details of the abrasive grain, the water-soluble polymer having the ether bond and the organic solvent in Tables 1 to 3 are shown in Tables 4 to 6, respectively.

<pH Measurement of Polishing Agent>

A pH of the polishing agent was measured on the following conditions. The results are shown in Tables 1 to 3.

Measurement temperature: 25±5° C.

Measuring apparatus: Trade name: Model (F-51) made by Horiba, Ltd.

Measurement method: using a pH standard solution (pH 4.01) of a phthalate, a pH standard solution (pH 6.86) of a neutral phosphate, and a pH standard solution (pH 9.18) of a borate, as pH standard solutions; calibrating the pH meter by three points; then putting an electrode of the pH meter in the polishing agent; and measuring the pH with the above-described measuring apparatus, at the time after 2 minutes or longer elapsed and the pH became stable.

<Measurement of Zeta Potential>

As for the zeta potential measuring apparatus, trade name: DELSA NANO C, which was made by Beckman Coulter, Inc., was used. A sample was obtained by diluting the polishing agent with pure water so that the scattering intensity of a measurement sample became $1.0 \times 10^4$ to $5.0 \times 10^4$ cps, in the zeta potential measuring apparatus. After that, the obtained sample was charged into a cell for measuring the zeta potential, and the zeta potential was measured. The results are shown in Tables 1 to 3.

<Evaluation of Polishing Characteristics>

As the base materials which were the objects to be polished (resin substrate having resin film), the base material obtained by forming a film-shaped heterocycle-containing resin having a thickness of 200 nm on a silicon substrate, and the base material obtained by forming a film-shaped polyimide resin having a thickness of 200 nm on a silicon substrate were used. The resin films were chemically-mechanically-polished for 60 seconds with the use of the polishing agent prepared in the above description, on the following polishing conditions. Incidentally, polishing of the polyimide resin was carried out in Examples 1 to 5, 9 to 10, and 15 to 18 and Comparative Examples 1 and 2.

[Substrate Polishing Condition]

Polishing apparatus: polishing machine for single side (made by Applied Materials, trade name MIRRA)

Polishing cloth: polishing cloth made of suede-like foamed polyurethane resin

Number of revolutions of platen: 93 times/min

Number of revolutions of head: 87 times/min

Polishing pressure: 14 kPa

Amount of polishing agent to be supplied: 200 mL/min

Cleaning was performed for 60 seconds by pressing the sponge brush (made of polyvinyl alcohol-based resin) against the surface to be polished of the resin substrate that had been polished in the above-described polishing step, and rotating the base material and the sponge brush while supplying distilled water to the surface to be polished. Next, the sponge brush was removed, and distilled water was supplied to the polished surface of the base material for 60 seconds. Finally, by rotating the base material at high speed, distilled water was scattered to dry the base material.

The polishing rate was calculated from the difference between film thicknesses obtained by measuring the film thicknesses of the resin film before and after polishing. For the measurement of the film thickness, a film thickness measuring apparatus (trade name: Lambda Ace, VL-M 8000LS, made by Dainippon Screen Manufacturing Co., Ltd.) was used. The results are shown in Tables 1 to 3.

TABLE 1

| Item | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Abrasive grain | Colloidal silica 1 | 3.000 | 3.000 | 3.000 | 3.000 | 3.000 | 3.000 | 3.000 | 3.000 | 3.000 | 3.000 |
| Water soluble polymer having ether bond | A1 | 0.300 | — | — | — | — | — | — | — | — | — |
| | A2 | — | 0.300 | — | — | — | — | — | — | — | — |
| | A3 | — | — | 0.300 | — | — | — | — | — | — | — |
| | A4 | — | — | — | 0.300 | — | — | — | — | — | — |
| | A5 | — | — | — | — | 0.300 | 0.300 | 0.300 | 0.300 | — | — |
| | A6 | — | — | — | — | — | — | — | — | 0.300 | — |
| | A7 | — | — | — | — | — | — | — | — | — | 0.300 |
| Organic solvent | Organic solvent 1 | 5.000 | 5.000 | 5.000 | 5.000 | 5.000 | 5.000 | 5.000 | 5.000 | 5.000 | 5.000 |
| Acid component | | Malic acid | Malic acid | Malic acid | Malic acid | Malic acid | Malic acid | Malic acid | Malic acid | Malic acid | Malic acid |
| Zeta potential (mV) | | 14 | 14 | 14 | 14 | 14 | 15 | 14 | 10 | 14 | 14 |
| pH of polishing agent | | 2.5 | 2.5 | 2.5 | 2.5 | 2.5 | 2.3 | 2.7 | 3.2 | 2.5 | 2.5 |
| Polishing rate for heterocycle containing resin (nm/min) | | 120 | 110 | 100 | 130 | 150 | 140 | 160 | 140 | 150 | 140 |
| Polishing rate for polyimide resin (nm/min) | | 320 | 310 | 280 | 330 | 340 | — | — | — | 330 | 300 |

TABLE 2

| Item | | Example 11 | Example 12 | Example 13 | Example 14 | Example 15 | Example 16 | Example 17 | Example 18 |
|---|---|---|---|---|---|---|---|---|---|
| Abrasive grain | Colloidal silica 1 | 3.000 | 3.000 | 3.000 | 3.000 | — | 3.000 | 3.000 | 3.000 |
| | Colloidal silica 2 | — | — | — | — | 3.000 | — | — | — |
| Water soluble polymer having ether bond | A5 | 0.100 | 0.050 | 0.020 | 0.010 | 0.300 | 0.300 | 0.300 | 0.300 |

TABLE 2-continued

| Item | | Example 11 | Example 12 | Example 13 | Example 14 | Example 15 | Example 16 | Example 17 | Example 18 |
|---|---|---|---|---|---|---|---|---|---|
| Organic solvent | Organic solvent 1 | 5.000 | 5.000 | 5.000 | 5.000 | 5.000 | — | — | 5.000 |
| | Organic solvent 2 | — | — | — | — | — | 5.000 | — | — |
| | Organic solvent 3 | — | — | — | — | — | — | 5.000 | — |
| Acid component | | Malic acid | Malic acid | Malic acid | Malic acid | Malic acid | Malic acid | Malic acid | Malic acid |
| Corrosion preventive material | Benzotriazole | — | — | — | — | — | — | — | 0.100 |
| Oxidizing agent | 30% hydrogen peroxide water | — | — | — | — | — | — | — | 0.300 |
| Zeta potential (mV) | | 14 | 14 | 14 | 14 | 14 | 14 | 14 | 14 |
| pH of polishing agent | | 2.5 | 2.5 | 2.5 | 2.5 | 2.5 | 2.5 | 2.5 | 2.5 |
| Polishing rate for heterocycle containing resin (nm/min) | | 150 | 130 | 110 | 100 | 120 | 160 | 160 | 150 |
| Polishing rate for polyimide resin (nm/min) | | — | — | — | — | 310 | 350 | 340 | 340 |

TABLE 3

| Item | | Comparative example 1 | Comparative example 2 | Comparative example 3 | Comparative example 4 | Comparative example 5 |
|---|---|---|---|---|---|---|
| Abrasive grain | Colloidal silica 1 | — | 3.000 | 3.000 | 3.000 | — |
| | Colloidal silica 3 | — | — | — | — | 3.000 |
| Water-soluble polymer having ether bond | A5 | 0.300 | — | 0.300 | 0.300 | 0.300 |
| Organic solvent | Organic solvent 1 | 5.000 | 5.000 | — | 5.000 | 5.000 |
| Acid component | | Malic acid | Malic acid | Malic acid | — | Malic acid |
| Zeta potential (mV) | | — | 14 | 14 | −40 | 10 |
| pH of polishing agent | | 2.5 | 2.5 | 2.5 | 8.3 | 3.0 |
| Polishing rate for heterocycle-containing resin (nm/min) | | 0 | 30 | 50 | 20 | 20 |
| Polishing rate for polyimide resin (nm/min) | | 0 | 70 | — | — | — |

TABLE 4

| Abrasive grain | Average particle diameter (nm) |
|---|---|
| Colloidal silica 1 | 70 |
| Colloidal silica 2 | 50 |
| Colloidal silica 3 | 20 |

TABLE 5

| Abbreviated name | Substance name | Weight average molecular weight | Manufacturing company |
|---|---|---|---|
| A1 | Polyoxypropylene polyglyceryl ether | 1000 | Sakamoto Yakuhin Kogyo Co., Ltd. |
| A2 | Polyoxyethylene polyglyceryl ether | 750 | Sakamoto Yakuhin Kogyo Co., Ltd. |
| A3 | Polyglycerin | 310 | Sakamoto Yakuhin Kogyo Co., Ltd. |
| A4 | Polyglycerin | 3000 | Daicel Corporation |
| A5 | Dextrin | 4100 | Sanwa Starch Co., Ltd. |

TABLE 5-continued

| Abbreviated name | Substance name | Weight average molecular weight | Manufacturing company |
|---|---|---|---|
| A6 | Dextrin | 100000 | Sanwa Starch Co., Ltd. |
| A7 | Cluster dextrin | 400000 | NIHON SHOKUHIN KAKO CO., LTD. |

TABLE 6

| Abbreviated name | Substance name |
|---|---|
| Organic solvent 1 | Propylene glycol monopropyl ether |
| Organic solvent 2 | Propylene glycol monomethyl ether acetate |
| Organic solvent 3 | Dipropylene glycol |

As are shown in Tables 1 to 3, when Examples and Comparative Examples are compared, it is understood that a favorable polishing rate for a resin is obtained by using polishing agents that comprise abrasive grains having positive charges and having average particle diameters of more than 20 nm, water-soluble polymers having an ether bond, organic solvents and water. When Examples 1 to 10 are compared, it is understood that in the case where a water-soluble polymer having a weight average molecular weight of 4000 or more is used among the water-soluble polymers having the ether bond, the polishing rate for a resin is high. When Examples 5 and 11 to 14 are compared, it is understood that in the case where the content of the water-soluble polymer having the ether bond is 0.010 mass % or more, the polishing rate for a resin is high.

REFERENCE SIGNS LIST 1 and 11 . . . substrate, 2 and 12 . . . silicon oxide, 3 and 14 . . . photoresist, 4 . . . groove portion, and 13 . . . resin.

The invention claimed is:

1. A polishing agent, comprising: abrasive grains; a water-soluble polymer comprising an α-glucose polymer; an organic solvent; and water, wherein the abrasive grains have a positive charge in the polishing agent, and an average particle diameter of the abrasive grains is larger than 20 nm, and pH of the polishing agent is 1.0 or more and less than 3.0.

2. The polishing agent according to claim 1, wherein the water-soluble polymer further comprises a polyether.

3. The polishing agent according to claim 1, wherein the abrasive grains comprise colloidal silica.

4. The polishing agent according to claim 1, wherein pH of the polish agent is 1.0 to 2.5.

5. The polishing agent according to claim 1, further comprising a corrosion preventive agent.

6. The polishing agent according to claim 1, further comprising an oxidizing agent.

7. The polishing agent according to claim 1, further comprising a pH adjusting agent.

8. The polishing agent according to claim 1, further comprising a surfactant in an amount of 0.0001 to 0.1 mass % based on a total mass of the polishing agent.

9. A multi-pack polishing agent for obtaining the polishing agent according to claim 1, the multi-pack polishing agent comprising:
a first liquid comprising the abrasive grains and the water, and
a second liquid comprising the water-soluble polymer, the organic solvent and the water.

10. A stock solution for obtaining the polishing agent according to claim 1, wherein the stock solution is diluted with water to obtain the polishing agent.

11. A polishing method comprising:
preparing a base material having a resin; and
chemically-mechanically polishing the base material by using the polishing agent according to claim 1 to remove at least a part of the resin.

12. A polishing method comprising:
preparing a base material having a resin;
obtaining a polishing agent by diluting the stock solution according to claim 10 with water; and
chemically-mechanically polishing the base material by using the polishing agent to remove at least a part of the resin.

13. A polishing method comprising:
preparing a base material having a resin;
obtaining a polishing agent by mixing the first liquid and the second liquid from the multi-pack polishing agent according to claim 9; and
chemically-mechanically polishing the base material by using the polishing agent to remove at least a part of the resin.

14. The polishing agent according to claim 1, wherein the α-glucose polymer is selected from the group consisting of amylose, dextran, dextrin, maltodextrin, cluster dextrin, α-cyclodextrin, β-cyclodextrin, γ-cyclodextrin, maltose, isomaltose, maltotriose and stachyose.

15. The polishing agent according to claim 1, wherein the average particle diameter of the abrasive grains is larger than 70 nm.

16. The polishing agent according to claim 6, wherein the oxidizing agent comprises an agent selected from the group consisting of hydrogen peroxide, peroxosulfate, potassium periodate, hypochlorous acid and ozone water.

17. The polishing agent according to claim 1, wherein the organic solvent comprises a solvent selected from the group consisting of glycols, derivatives of the glycols, and a combination thereof.

18. The polishing agent according to claim 1, further comprising an acid component.

19. The polishing agent according to claim 1, further comprising a polishing inhibitor for an insulating material.

* * * * *